United States Patent
Hewitt-Bell et al.

(10) Patent No.: US 6,376,375 B1
(45) Date of Patent: Apr. 23, 2002

(54) PROCESS FOR PREVENTING THE FORMATION OF A COPPER PRECIPITATE IN A COPPER-CONTAINING METALLIZATION ON A DIE

(75) Inventors: Melody G Hewitt-Bell, Kokomo; Steven Michael Stansberry, Elweood, both of IN (US)

(73) Assignee: Delphi Technologies, Inc., Troy, MI (US)

(*) Notice: Subject to any disclaimer, the term of this patent is extended or adjusted under 35 U.S.C. 154(b) by 0 days.

(21) Appl. No.: 09/482,777

(22) Filed: Jan. 13, 2000

(51) Int. Cl.$^7$ .............................................. H01L 21/44
(52) U.S. Cl. ...................................... 438/687; 438/688
(58) Field of Search .................................. 438/687–688

(56) References Cited

U.S. PATENT DOCUMENTS

| | | | |
|---|---|---|---|
| 4,035,201 A | * 7/1977 | Anderson | 148/11.5 A |
| 4,699,673 A | * 10/1987 | Kobayashi et al. | 148/11.5 A |
| 5,122,199 A | * 6/1992 | Schroth | 148/528 |
| 5,205,878 A | * 4/1993 | Kanzaki et al. | 148/684 |
| 5,810,949 A | * 9/1998 | Chakrabarti et al. | 148/535 |
| 5,900,076 A | * 5/1999 | Hayashi et al. | 148/330 |

FOREIGN PATENT DOCUMENTS

JP          59047339        * 3/1984

* cited by examiner

Primary Examiner—John F. Niebling
Assistant Examiner—Thanh Nguyen
(74) Attorney, Agent, or Firm—Jimmy L. Funke

(57) ABSTRACT

A process for preventing the formation of a copper precipitate in a copper-containing metallization on a die, wherein the process includes the steps of: identifying each manufacturing step after metallization which exposes the die to a temperature of greater than 100° C.; and after performing such post-metallization step, cooling the die down to a temperature of at least 100° C. at a cooling rate in a range of 0.6° C. per second to 1.0° C. per second, and more specifically in a range of 0.59° C. per second to 1.00° C. per second. The step of cooling the die can be achieved by utilizing any of numerous means including an air conditioning system with a thermocouple for monitoring the cooling rate, a substantially closed manufacturing environment housing having a ventilation port with an electrically operable fan system mounted proximate the ventilation port, a cooling rack having artificial ventilation, and/or a chiller plate.

15 Claims, 6 Drawing Sheets

PROCESS FOR PREVENTING THE FORMATION OF A COPPER PRECIPITATE IN A COPPER-CONTAINING METALLIZATION ON A DIE

TECHNICAL FIELD

The present invention relates to semiconductor wafer fabrication and, more particularly, to a process for preventing the formation of a copper precipitate in a copper-containing metallization on a wafer or die.

BACKGROUND OF THE INVENTION

In the modern electronics industry, microelectronic devices are commonly mass-produced as integrated circuits (ICs) which are fabricated and processed on silicon wafers. A given silicon wafer, for example, may be from 4 to 12 inches in diameter and have an array of as many as several hundred separate device locations, commonly referred to as die locations. Each location will ultimately contain an individual microelectronic device once fabrication and processing of the wafer is completed. Once the individual microelectronic devices are fabricated and processed to completion on the wafer, the wafer is then ultimately rendered into separate individual sections commonly referred to as "die," "microchips," or "chips." Each microchip corresponds to a particular device location on the previously unseparated wafer. In accordance with conventional terminology in the field, the term "die" is used as a singular and plural form, that is, referring to one unit on a wafer or multiple units on a wafer. (See "Microchip Fabrication" 3rd Edition, by Peter Van Zant, published by McGraw-Hill, 1997, page 592.)

Once the active and passive components of the individual microelectronic devices on the wafers are initially formed, process steps are carried out which deposit, via sputtering techniques, one or more patterned layers of conducting metal such as, for example, metal interconnect lines on the wafer so that the device components on each individual die can be electrically connected. During these same process steps, metal bond pads are formed and thereby situated on, typically, the perimeter of the die as well. In general, the materials and process steps which form such conducting metal and metal bond pads are referred to herein as "metallization."

After metallization, a passivation layer, commonly comprising silicon dioxide, is formed over every die on a given wafer. This passivation layer is intended to protect the microelectronic devices contained on the wafer die during post-fabrication testing, packaging processes, and ultimate consumer use. The passivation layer, however, is carefully and selectively patterned to leave the metal bond pads exposed, and not covered by passivation on each die, so that these metal bond pads can be electrically accessed later on in the manufacturing process, for example, during packaging.

After the passivation layer is formed and patterned on a given wafer, the wafer is then ultimately physically separated into individual microchips or die. Once separated from each other, each individual microchip is then typically mounted within its own separate package having external leads. Once each die is mounted within a package, the metal bond pads on the packaged die are wirebonded to internal leads within the package which electrically correspond to the external leads of the package. Thereafter, the die is sealed in the package.

An aluminum/copper/silicon (hereinafter "Al/Cu/Si") alloy is typically the material of choice for metal interconnect lines and metal bond pads and is currently used throughout the semiconductor and microelectronics industry. Other copper-containing materials are useful as hereinafter explained. Such an Al/Cu/Si alloy offers many material properties which are particularly advantageous for the increasingly small geometries prevalent in the microelectronics industry today. Some of the advantages resulting from such material properties include improved metal step coverage, resistance to electromigration, and a decrease in metal surface defects such as, for example, hillocks. While such material properties are beneficial, and for some microelectronic devices critical for initial quality and product longevity, there are certain process control problems regarding the metal reactivity of the Al/Cu/Si alloy which occur during both fabrication and post-fabrication phases of the overall microelectronic manufacturing process. In particular, premature erosion and/or corrosion of the Al/Cu/Si metallization due to its reactivity is a common problem in the microelectronics industry. Although various manufacturers have made various attempts to pinpoint and solve the problem, no completely satisfying solution has yet been found.

Metal reactivity and subsequent corrosion of device metallizations are of great concern to manufacturers in the semiconductor microelectronics industry. The analysis labs of such manufacturers commonly have a steady stream of failed devices being submitted for elemental analysis to determine if corrosion played a part in the failures of the devices. Furthermore, "seasonal corrosion" often can wipe out entire device inventory lines in post-fabrication and/or downstream manufacturing areas, such as, for example, in wafer/die test areas, in wafer dicing or sawing areas, and/or in wirebond/packaging facilities. Thus, reducing metal reactivity is and has always been a high priority for manufacturers in both the fabrication and post-fabrication manufacturing areas.

As a first proposed remedy for reducing and/or eliminating the reactivity of bulk Al/Cu/Si solutions, manufacturers have tried anodizing the surface of the exposed metal bond pads of the devices. Manufacturers accomplished this by increasing the thickness of the native surface oxide through various oxygen rich and low temperature bakes. As a result, increasing the native oxide thickness effectively reduces the effect of mild forms of corrosion and erosion such as the pitting corrosion/mottling exhibited on metal bond pads exposed to deionized (DI) water rinses. However, such an increase in the native oxide thickness does not prevent corrosion resulting from the more aggressive attack of ionic contaminants such as fluorine or chlorine. The cathodic potential between copper and aluminum is 0.047 v/wt %, thus making the metal bond pad surface highly reactive. Thus, when ionic contaminants, or even a gold ball bond on a metal bond pad of a microchip during the microchip packaging (wirebond) process, are introduced to the Al/Cu/Si solution, the surface reactivity can undesirably increase almost exponentially.

As a second proposed remedy for reducing and/or eliminating the reactivity of bulk Al/Cu/Si solutions, other manufacturers have tried to limit the exposure of the Al/Cu/Si metallization solution to various corrosion and/or erosion accelerants. Such is accomplished by maintaining a high level of cleanliness within both the fabrication and post-fabrication manufacturing areas and/or by protecting the exposed metallization with various compounds, such as gels or encapsulants. However, while increasing the cleanliness of, for example, the microchip packaging and assembly area is desirable, it is not necessarily a feasible solution for all packaging areas. The reason for this is because many production areas are considered to be "open" manufacturing facilities and, therefore, have no separation from the surrounding, marginally-clean factory environment. As a practical matter, microchips or die with exposed metal bond pad metallization, or any other similar metallization, continue to be susceptible to corrosion resulting from an unclean environment.

As a third proposed remedy for reducing and/or eliminating the reactivity of bulk Al/Cu/Si solutions, some manufacturers have eliminated copper from their device metallizations altogether. However, while some microelectronic devices can function properly throughout their lifetime without the addition of copper, other devices need it for their long-term reliability. More particularly, copper additives are utilized throughout the semiconductor microelectronics industry to increase metal step coverage on increasingly small metal line widths and geometries commonly found in devices today. Furthermore, other high current density devices incorporate copper to prevent metal electromigration and thereby increase their respective product life. In light of such, the removal of copper from the metallization solution on many devices is not feasible or practical.

Due to the inherent shortcomings of the above-proposed remedies, there exists a present need in the art for increasing the robustness of Al/Cu/Si solution metallizations by reducing the solution reactivity.

SUMMARY OF THE INVENTION

The present invention provides a process for preventing the formation of a copper precipitate in an aluminum/copper/silicon metallization on a die. In its most basic form, the process according to the present invention includes the steps of identifying each manufacturing step after metallization which exposes a given metallized die or group of dies to a temperature of greater than 100° C. and through appropriate die handling and environmental control, cooling the die down to a temperature of at least 100° C. (100° C. or less) at a cooling rate of between about 0.6° C. and 1.0° C. per second after each identified manufacturing step. By cooling the die or dies in this manner, the formation of a copper precipitate in the metallization on the die or dies is prevented. By preventing such copper precipitate formation, premature erosion and/or corrosion of the metallization is also prevented. Moreover, the wire bond strength of metallized bond pads is maintained.

As hereinafter explained, the step of cooling the die or dies is often best achieved by means of an apparatus for controlling the environment in which the die or dies are placed; controlling the cooling environment is referred to herein as "artificial" cooling and is to be distinguished from "natural" cooling as, for example, might involve simply turning off a heat source and allowing heat to dissipate.

In one embodiment of the present invention, such an artificial cooling system may include, for example, an enclosure having an air conditioning system with a thermocouple for monitoring the cooling rate. Such a system is utilized by removing the die or dies from the heating facility to the cooling environment quickly. In another embodiment, the artificial cooling system may include, for example, a substantially closed manufacturing environment housing having a ventilation port with an electrically operable fan system mounted proximate the ventilation port to pull in cool air and exhaust warm air. In still another embodiment, the artificial cooling system may include, for example, a cooling rack having forced and/or temperature controlled ventilation. In still yet another embodiment, the artificial cooling system may include a chiller plate served by temperature controlled water.

Advantages, design considerations, and applications of the present invention will become apparent to those skilled in the art when the detailed description of the best mode contemplated for practicing the invention, as set forth hereinbelow, is read in conjunction with the following drawings.

BRIEF DESCRIPTION OF THE DRAWINGS

The present invention will now be described, by way of example, with reference to the following drawings.

DESCRIPTION OF THE PREFERRED EMBODIMENTS

Figure 1:
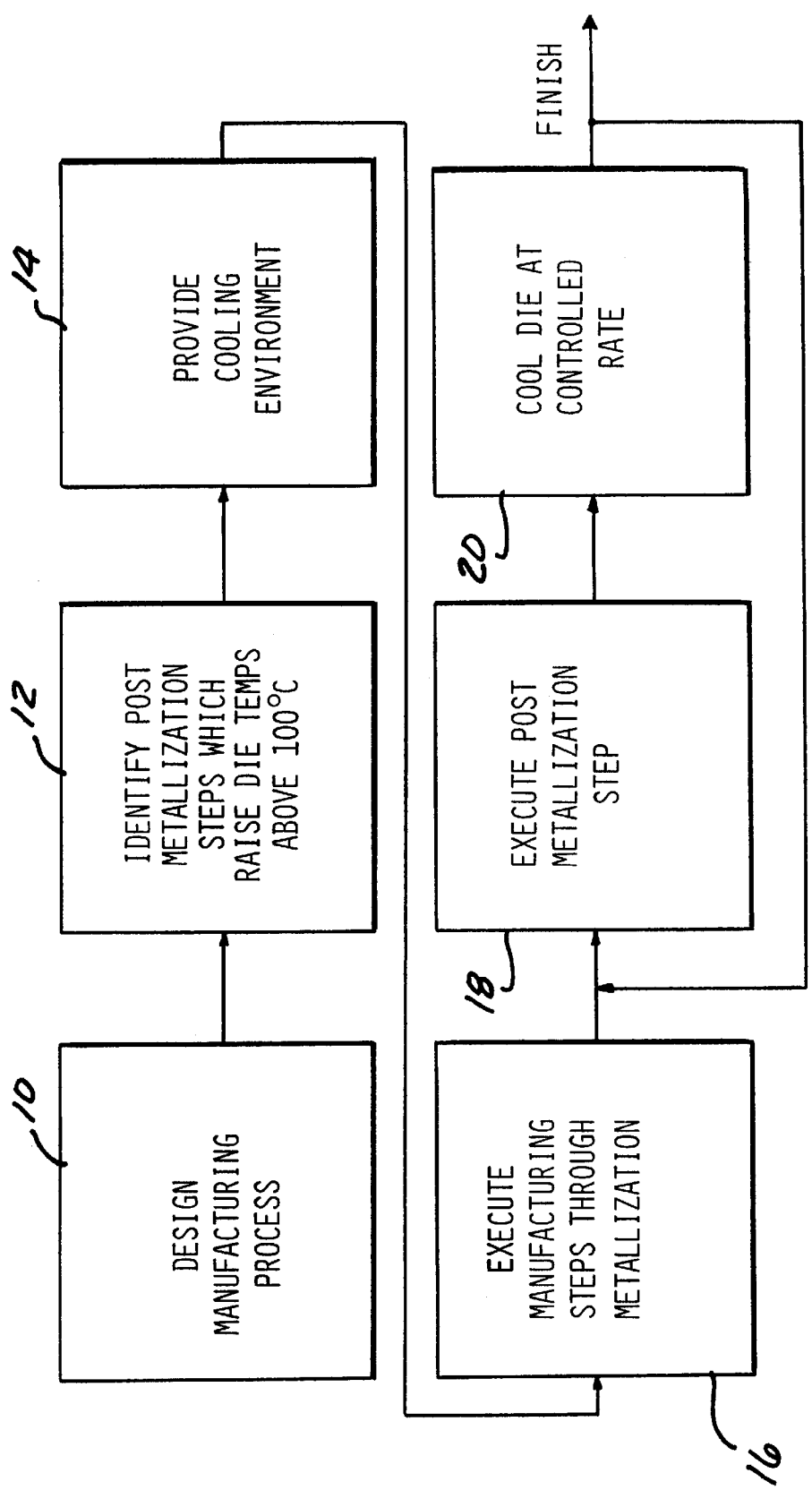
FIG. 1 is a flow diagram of a generalized process according to the present invention.

The object of this invention is the reduction of the surface reactivity of copper-containing metallizations such as, for example, exposed metal bond pads by specifically preventing copper precipitation as a result of post-metallization manufacturing steps which involve subjecting the die to temperatures in excess of 100° C. By specifically preventing such copper precipitation, the overall susceptibility of the metallization to premature and/or accelerated environmental corrosion and erosion is significantly reduced. Furthermore, the specific prevention of copper precipitation according to the present invention also promotes homogeneous metal bonding surfaces on the metal bond pads which is most desirable and necessary to ensure good intermetallic initiation at wirebond and, therefore, ultimately increases the long-term reliability of microelectronic device performance. Before further describing the invention, it is useful to understand the problem to which the invention is directed.

Until discovery of the present invention, early and premature microelectronic device failures in the field were common, and such failed devices were returned by customers to manufacturers for inspection and analysis. Preliminary visual inspections of the failed devices performed by manufacturers often led to the conclusion that premature and/or accelerated metal corrosion had occurred on the exposed metal bond pads of the failed devices. This conclusion was primarily based on significant portions of missing metal at the corners of the metal bond pads which were visually observed on the failed devices. However, recent SEM (scanning electron microscope) and EDX analyses associated with the present invention, and which have given rise to the present invention, have conclusively indicated that the primary root cause of the premature device failures was actually premature aluminum erosion and/or exfoliation specifically initiated by copper precipitation from the bulk Al/Cu/Si solution.

In *ASM Specialty Handbook: Aluminum and Aluminum Alloys*, p. 598 (Joseph R. Davis, editor; 1996), "exfoliation" is described as "corrosion" initiating "between bimetallic couples and progresses along grain boundaries as an intergranular crack" wherein the "crack widens into a crack plane and enlarges into multiple crack planes." Furthermore, "corrosive oxides press outward against the adjacent metal, thus producing a pattern of delamination." Such cracking and delamination occurs in "products that have markedly directional structures in which highly elongated grains form platelets that are thin relative to their length and width." Exfoliation is "primarily caused by the unfavorable distribution of precipitate," for example, copper precipitation from bulk Al/Cu/Si metallization. Furthermore, it is known that copper precipitation from a bulk metallization results in increased susceptibility to intergranular corrosion. Thus, if basic Al/Cu compounds are not properly protected from exposure to moisture or other corrosive elements, device failure due to corrosion will prematurely occur in the life of the device. More particularly, such premature or accelerated corrosion results in the loss of the least noble metal, that is, the anode, aluminum, while protecting the more noble metal, that is, the cathode, copper.

It is generally believed that copper precipitation from a bulk Al/Cu solution is a natural progression of the material aging process, especially when the bulk solution is supersaturated at room temperature (saturation occurs at 0.25 wt % Cu). Artificial means, such as, for example, elevated temperatures, can be used to increase the speed at which copper will precipitate out of the bulk solution. In many heavy industrial applications, for example, copper precipitation is purposely promoted because of the increase in strength and/or hardness of the overall material that results. In contrast, however, in the semiconductor microelectronics industry, copper precipitation can result in the undesirable and premature corrosion or erosion of exposed metallizations such as, for example, exposed metal bond pads in microelectronic devices. Because some post-fabrication and/or downstream manufacturing operations utilize many high-temperature processing steps above 100° C., copper precipitation can result with disastrous effects on device reliability.

Al/Cu/Si (98:1:1) is considered to be a supersaturated, solid solution at room temperature. The natural aging process that occurs over time ultimately results in the precipitation of Cu or $AlCu_2$ at the metal grain boundaries, even after the solution has been heat-treated and quenched. Such precipitation due to natural aging gives rise to the metastable reputation of the solution. The variety of intermetallic phases in aluminum alloys occurs because aluminum is highly electronegative and trivalent; in other words, they are very active in the emf series. "Details depend on ratios and total amounts of alloying elements present and require reference to the phase diagrams for prediction. It must be kept in mind, however, that metastable conditions frequently prevail that are characterized by the presence of phases that are not shown on the equilibrium diagram. Some phases are unstable and quickly or gradually disappear during subsequent thermal treatment. The phases that appear depend on the rate of solidification." *ASM Specialty Handbook: Aluminum and Aluminum Alloys*, p. 33 (Joseph R. Davis, editor; 1996). Thus, as previously indicated, when copper (or $AlCu_2$) precipitates, the Al/Cu/Si solution becomes highly reactive and susceptible to corrosion and erosion.

Aluminum can hold approximately 0.2 wt % copper in solid solution at room temperature. However, at much higher temperatures, for example, at 500° C., aluminum can hold over 5.5 wt % copper, thus becoming a supersaturated solution. If a supersaturated Al/Cu/Si alloy is slowly cooled from a high temperature, Cu or $CuAl_2$ will precipitate at the aluminum grain boundaries. However, if a supersaturated solution is taken to a high temperature and then quickly cooled via quenching, the microstructure at room temperature will be homogeneous. This homogeneous microstructure is considered "metastable," meaning that there will be a tendency for the copper atoms to diffuse through the lattice forming Guinier-Preston (GP) Zones (see *ASM Specialty Book: Aluminum and Aluminum Alloys*, p. 34 (Joseph R. Davis, editor; 1993)), which are the precursors for Cu or $CuAl_2$ precipitation. The formation of GP Zones is a common phenomenon considered to be part of the natural progression of the material aging process. Artificial means such as elevated temperatures or mechanical/electrical stress can be used to increase the speed at which copper will precipitate out of the solution.

Typically, there are three different methods for promoting or accelerating the occurrence of copper precipitation. These methods all involve the introduction of stress through thermal, mechanical, or electrical means. While examples of accelerated copper precipitation due to mechanical and electrical stress seem less common, the most common cause of accelerated copper precipitation is due to thermal stress. For this reason, the present invention was developed to specifically address copper precipitation resulting from thermal stress commonly applied in both fabrication and post-fabrication manufacturing areas in the semiconductor microelectronics industry.

In *ASM Specialty Book: Aluminum and Aluminum Alloys*, p. 35 (Joseph R. Davis, editor; 1993), it is indicated that precipitation heat treatment or artificial aging may occur between the temperature range of 120° C. to 230° C. for all alloy types. However, experimentation leading to the present invention has indicated that solution stability can be achieved at these temperatures for long periods of time. Experimentation has further specifically indicated that the precipitation that does occur depends upon the rate of cooling after exposure to such high temperatures.

"Corrosion" is most simply defined to be the deterioration that results from the chemical reaction that occurs between a metal alloy and its environment. Intergranular corrosion (IGC) occurs when voltage potential differences exist between the grain boundaries and the grain bodies, such as the bimetallic coupling of aluminum and copper. Therefore, when copper is precipitated in a relatively continuous network along grain boundaries, the preferential attack of the boundaries caused by the increased surface reactivity can allow entire metal grains to be exfoliated. The corrosion will progress along the grain boundaries as an intergranular crack that widens into a crack plane. When multiple planes occur, the exfoliation or dropping out of a grain occurs. Per *ASM Specialty Book: Aluminum and Aluminum Alloys*, p. 598

(Joseph R. Davis, editor; 1993), "exfoliation most often occurs in products that have markedly directional structures in which highly elongated grains are thin relative to their length and width . . . and is primarily caused by the unfavorable distribution of precipitate."

Furthermore, "[m]ost corrosion reactions involve water in either the liquid or the condensed vapor phase" and are thus considered to be electrochemical in nature. Denny A. Jones, Principles and Prevention of Corrosion, p. 7 (Prentice-Hall; 1992). Often, water merely acts as an accelerant or catalyst for the corrosion reaction. However, on rare occasions, in the absence of all other reduction reactions, water can perform the cathodic reduction. Ibid. For eroding metals, the anodic reaction is often in form of $M \rightarrow M^{n+} + ne^-$ while the cathodic reduction can occur as $2H_2O + 2e^- \rightarrow H_2 + 2OH^-$. Ibid. at pp. 6–7.

For Al/Cu/Si solutions, the electrochemical corrosion reaction results in the loss of the least noble metal such as the anode, aluminum, while protecting and retaining the more noble metal such as the cathode, copper. Experimentation leading to the present invention has indicated that when a metal bond pad comprising a precipitated Cu/Al compound is gold wirebonded during packaging, the surface reactivity of the metal bond pad can increase to such a degree that the aluminum can be completely exfoliated after only five minutes of exposure to DI water. Because post-fabrication or downstream manufacturing operations often utilize what are considered high temperatures above 100° C. in many of their respective processing steps, copper precipitation can result with disastrous effects on device reliability. This is especially true when sylgard or gel encapsulants are utilized to cover the devices. Thus, prevention of copper precipitation remains a concern throughout the manufacturing life of a microelectronic device, including during both fabrication and post-fabrication operations.

While gross copper precipitation results in relatively large "surface puddles" that quickly oxidize and turn visibly brown upon exposure to a room environment, the early stages of copper precipitation are not readily visibly detectable by optical microscopy. The precipitation phenomenon is also difficult to detect using the normal, "secondary mode" of a scanning electron microscope (SEM). Thus, the "back-scatter mode," which is a feature on the SEM that uses atomic differences in the metal solution to highlight the elemental copper placement within that solution, is instead utilized to aid in precipitation detection.

Beyond qualifications initially specified by customers for specific devices or device families, fabrication engineers have historically not delved into reviewing package processing specifications to determine whether revisions are needed to prevent possible post-fabrication problems. Thus, historically, failed devices have been determined by manufacturers to have occurred because of gross contamination. Ultimately, however, it was the careful investigation of such incidents in connection with the present invention that gave rise to the present invention.

In connection with the present invention, failed devices were analyzed. Because no corrosion by-products were discovered at the time of the initial analysis, the failed product was examined utilizing the SEM backscatter mode, a feature on the SEM that uses atomic differences to highlight elemental copper placement within an aluminum solution. From this starting point, it was conclusively determined that the devices failed as the result of copper precipitation and the consequent increased metal surface reactivity on the metal bond pads. In addition, such copper precipitation was successfully reproduced by varying the cool-down rates of devices after exposure to the post-fabrication, downstream solder pot process. From here, an experiment was performed to determine what cool down rates were necessary so that copper precipitation would not occur during the manufacturing process. This experiment was enlarged to include many different Al/Cu/Si device metallization schemes, including both single and dual level metal schemes. From the information derived from the experiment, it was concluded that to provide a device with Al/Cu/Si metallization that is devoid of copper precipitation, a cool down rate on the order of about 0.6° C. per second to about 1.0° C. per second and more specifically in a range of 0.59° C. and 1.00° C. per second is needed whenever the device is taken to temperatures above 100° C.

More particularly, the problem of copper precipitation specifically causing increased, surface reactivity of the exposed metallizations was first determined while evaluating corroded devices which had prematurely failed in the field. In one instance, several two die (designated as device A and device B) components were analyzed because, upon optical inspection, device A exhibited missing aluminum on the exposed metal bond pads. Visually, device B appeared normal and unexposed to the assumed corrosive agent. Conventional thinking would conclude that the device A samples were contaminated before they were placed in the package and that the corrosion reaction had slowly progressed until component failure occurred. Conventional thinking would lead to the hypothesis that if the contamination of device A had occurred after placement in the package, both die would have exhibited similar effects from the corrosive agent. Such conventional thinking was discarded and X-Ray EDX was conducted.

Upon energy dispersive X-Ray analysis (EDX) of the device A samples, no corrosive contaminants were detected on the reaction sites. Normally, in corrosion failures, the reaction sites would yield significant elemental energy peaks that would allow for the corrosive agent to be identified. However, in addition to no unusual peak detection, EDX analysis proved that no metal surface differences existed between any device A and device B samples submitted. From this information, it was concluded that die contamination prior to package placement had not occurred to device A samples. Therefore, another phenomenon had to have driven the reaction that resulted in the missing aluminum and the ultimate failure of the components.

Once highly ionic contaminants were ruled out, further analyses of the failure sites was performed. From these further analyses, it was noticed that several device A failure sites revealed that copper was the only remaining solution constituent left behind after the metal bond pads were completely eroded away. Furthermore, the remaining copper particles were much larger than typical for the age of the device. Prompted by this information, the backscatter mode on the SEM was utilized to determine the distribution of copper in the remaining bulk aluminum. From these SEM scans, it was determined that all of the device A samples had experienced significant copper precipitation. Further investigation proved that all device B samples had also experienced significant copper precipitation, although to a lesser degree than the device A samples. The retained wafer test skeletons for the die being studied were analyzed and no copper precipitation was evident. Therefore, it was concluded that the parts had experienced artificial aging and that the incidents had occurred after the die were placed in the package housing together. In addition, the underlying nitride, which can act as a virtual recorder for metal phenomena, at the failure sites exhibited a pattern that was consistent with an erosion/corrosion attack at the metal grain boundaries. From this data, it was apparent that the component failures were the result of copper precipitation increasing the surface reactivity of the exposed metallization to such a degree that water, or a weak, organic acid in the presence of water, completely eroded the aluminum from the exposed metal bond pads. In light of such, the most important task then revolved around finding the initiator of the copper precipitation and where the exposure to the water had occurred.

Three processes steps in the fabrication process were investigated. These processes were simulated according to the process set-ups at the time that the field failure devices were manufactured. Such processes include dipping devices or certain parts thereof into a pot of molten solder. At that time, the solder pot operation did not have air conditioning/cooling vents in place. In addition, there was not even any ambient air movement as would occur with a fan. When the solder pot manufacturing process was modeled under these particular conditions, copper precipitation occurred.

Once this was determined, problem resolution was ultimately obtained by performing an additional design of experiments to determine the required process quench rates. Many cooling profiles were examined for all thicknesses and types of Al/Cu/Si metallization, and it was concluded that a cool down rate of between about 0.60° C. per second and about 1.0° C. per second must be achieved to prevent copper precipitation from the bulk metal Al/Cu/Si solution. Thus, once the solder pot operation was modified to maintain that cool down rate, the problem of copper precipitation was eliminated and has not since reoccurred.

The source of the copper precipitation accelerant, water, was also identified. From evaluating historical samples, it was determined that the devices manufactured during the failure timeframe were exhibiting an unusually high number of sylgard voids at the die level. Sylgard voids, while not typically considered hazardous, can act as moisture traps. More particularly, when such voids occur at the die level, they will allow moisture, and any other ambient contaminants, to remain in contact with the metallization. Over time, such moisture and/or any other ambient contaminants can result in the corrosion or erosion of the exposed metal bond pads of the devices. Therefore, when copper precipitation and sylgard voids were both found to be present on the same device, device failure was inevitable. However, once both of these problems were eliminated, the device failure footprint did not reoccur.

In light of the previous discussion and related discoveries, the present invention provides a process for preventing the formation of a copper precipitate in an exposed aluminum/copper/silicon metallization, for example, exposed metal bond pads, on a device die. In its most basic form, as illustrated in FIG. 1, the process according to the present invention is shown in FIG. 1 to include the step 10 of designing the die manufacturing process which is required to produce a desired device. This process includes manufacturing steps up through the step of metallization 16 such as the sputtering deposition of an aluminum, copper, silicon alloy using known techniques. One or more post-metallization steps follow, at least some of which involve raising die temperatures to 100° C. or more (step 18). Examples are universal forming gas/microalloying, thin film deposition and bonding in which Al:Cu:Si of 98:1:1 is a common metallization composition. The invention embraces other copper-containing alloys such as Al:Cu of 99:1; Al:Cu of 96:4; and Al:Cu:Si of 98.5:0.5:1.

Step 12 involves the identification of those post-metallization steps which involve temperatures in excess of 100° C.

Step 14 indicates that for each such step as is identified in Step 12, a suitable cooling environment and utilization technique must be designed and provided for the die or wafers to immediately follow the identified, high-temperature post metallization step or steps 18 in the overall process. Specific examples include (1) fast transfer of the wafers from the ovens to a cooling environment, (2) providing a flow of conditional air in the cooling environment, and (3) providing a water-circulating chiller plate designed to receive glass bonded wafers. The objective of the cooling atmosphere or environment is to bring the wafers to or under 100° C. and, preferably to about 27° C. at a rate of between about 0.6° C. per second and about 1.0° C. per second. It was determined that 0.59° C. per second was the lowest cooling rate consistent with our quality objectives. The upper limit of about 1° C. per second is dictated as much as anything by thermal shock considerations, i.e., a higher chill rate may cause wafer cracking and has not been found to produce any benefit as far as copper precipitation prevention is concerned.

Typically, step 20 is achieved by utilizing an artificial cooling system such as in an air conditioned enclosure with a thermocouple for monitoring the cooling rate. Air conditioning may include, for example, a substantially closed manufacturing environment housing having a cool air inlet and a ventilation port with an electrically operable fan system mounted proximate the ventilation port and providing air to the housing at between about 0° C. and 30° C. In still another embodiment, the artificial cooling may include, for example, a cooling rack. In yet another embodiment, the artificial cooling system may include, for example, a chiller plate adapted to receive glass bonded wafers and having internal circulation plumbing to receive chilled water which circulates through the plate at a rate sufficient to maintain a plate temperature of about 25° C.

Implementation of the process according to the present invention is hereinafter explained by way of several examples involving process steps which are used in the manufacturing process of semiconductor microelectronic devices today.

EXAMPLE 1

Figure 2:
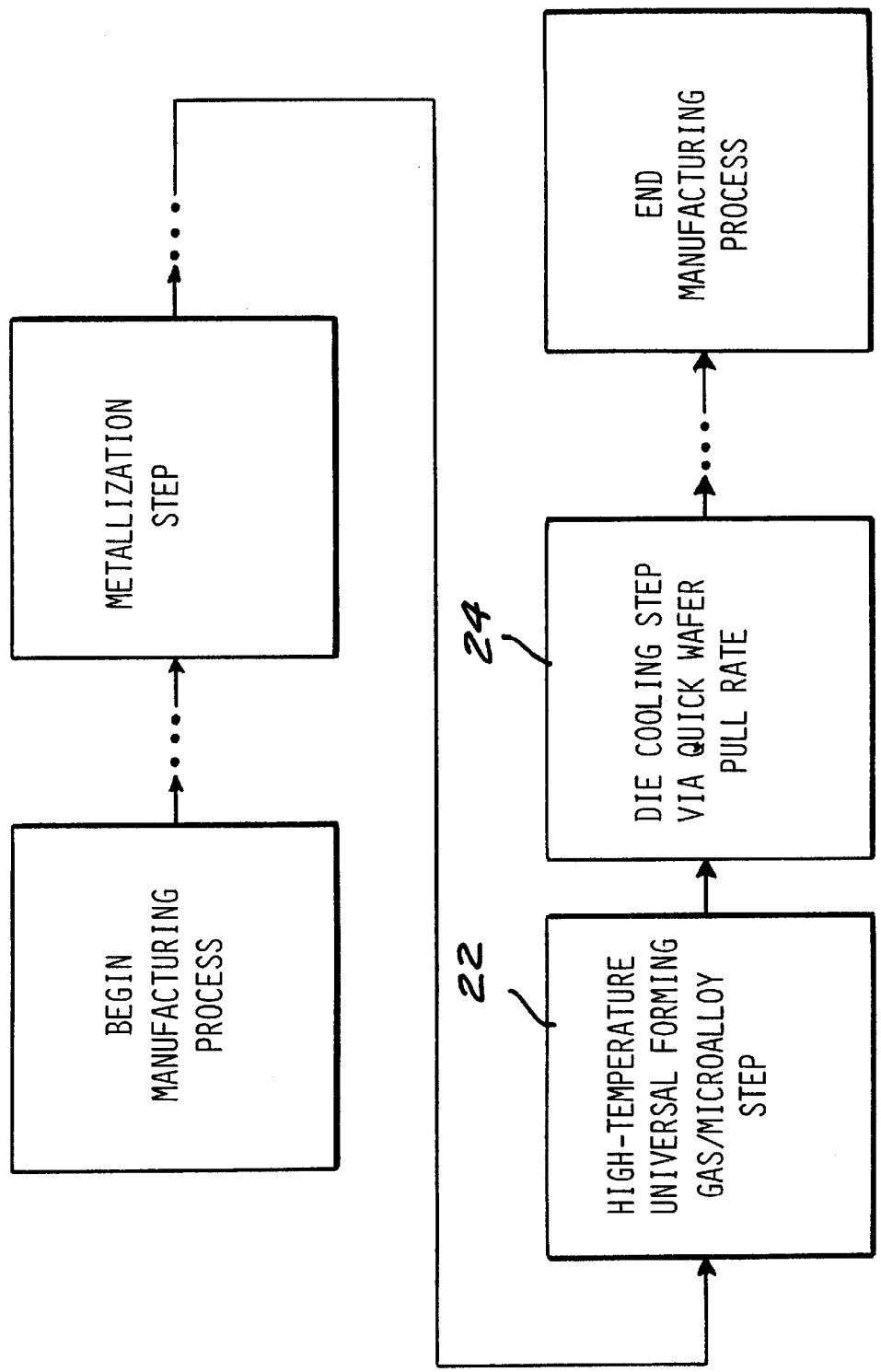
FIG. 2 is a general flow diagram of a process for the manufacturing of semiconductor microelectronic devices which particularly highlights how and when device die are cooled after a post-metallization, high-temperature universal forming gas/microalloy process step.

FIG. 2 show a manufacturing process for semiconductor microelectronic devices using a post-metallization manufacturing step 22 which exposes device product wafers to temperatures greater than 100° C. In particular, the identified microalloy step exposes wafers to a temperature of approximately 450° C. for 20 to 30 minutes as part of a universal forming gas/microalloy process within a furnace tube. Immediately after execution of the identified microalloy step, a cooling step 24 is performed in which the wafers are pulled from the furnace tubes within from 30 seconds to about 10 minutes and placed in a temperature-controlled environment, e.g., an enclosure having a controlled air temperature of between about 0° C. and 65° C., to make sure that the wafers are cooled to at least 100° C. (100° C. or less) at a rate of between about 0.60° C. per second and 1.0° C. per second in accordance with the present invention to thereby prevent premature copper precipitation.

EXAMPLE 2

Figure 3:
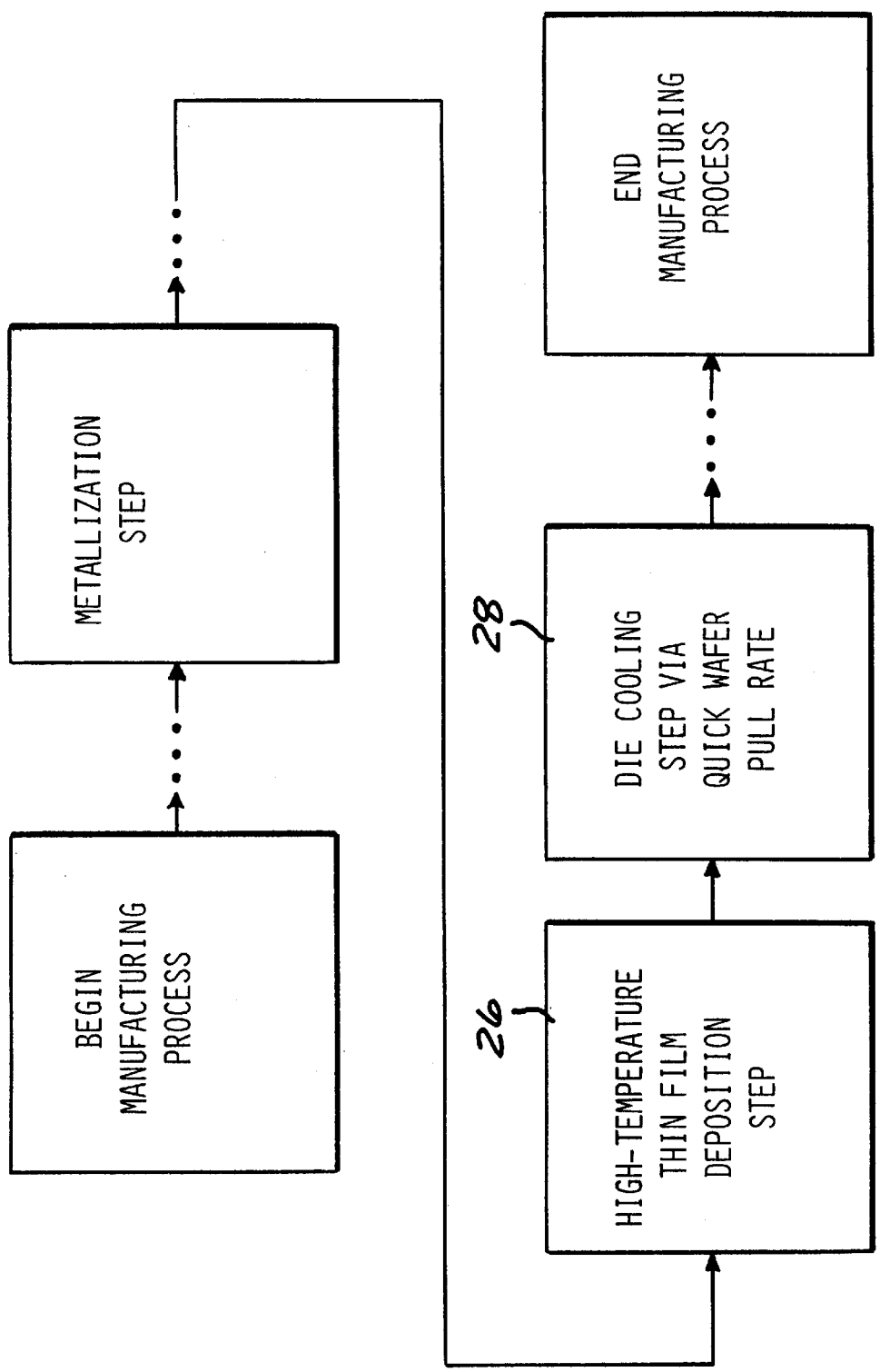
FIG. 3 is a general flow diagram of a process for the manufacturing of semiconductor microelectronic devices which particularly highlights how and when device die are cooled after a post-metallization, high-temperature thin film deposition process step.

FIG. 3 shows the post-metallization step 26 as a thin film deposition process step which exposes device product wafers to temperatures greater than 10020 C. In particular, the identified thin film deposition step 26 exposes wafers to a temperature greater than 100° C. as part of a thin film (for example, a plasma oxide or a nitride) deposition process within an enclosed chamber environment. Immediately after execution of the identified thin film deposition step, the wafers are quickly pulled from the chamber(s) at a sufficient "wafer pull rate" and placed in a temperature-controlled environment (step 28) to make sure that the wafers are cooled to at least 100° C. at a rate of between about at least 0.6° C. per second and 1.0° C. per second in accordance with the present invention to thereby prevent premature copper precipitation.

EXAMPLE 3

Figure 4:
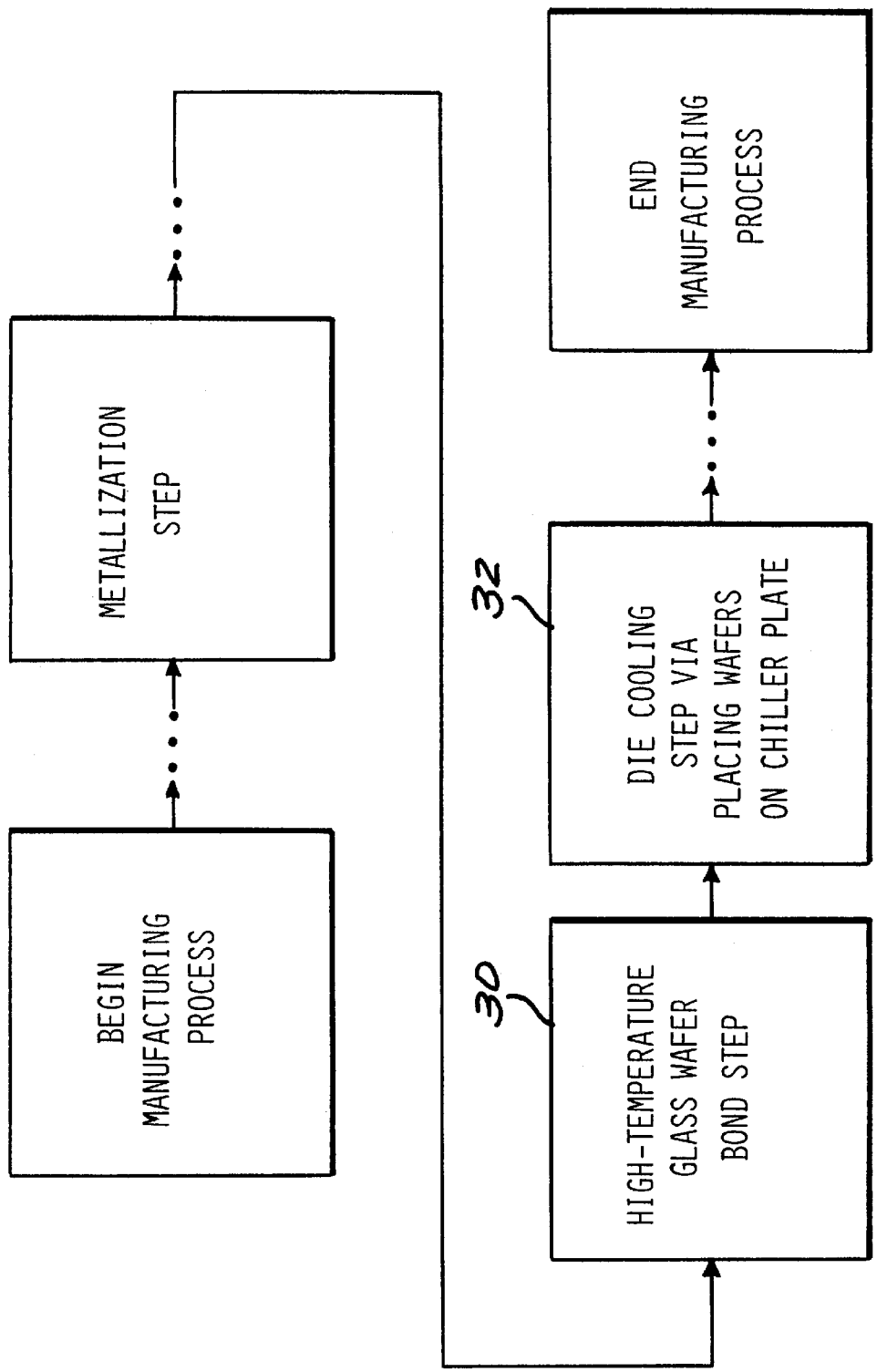
FIG. 4 is a general flow diagram of a process for the manufacturing of semiconductor microelectronic devices which particularly highlights how and when device die are cooled after a post-metallization, high-temperature wirebond process step.

In FIG. 4, the post-metallization step 30 is a glass/silicon bonding process step 30 which exposes device die to temperatures greater than 100° C. In particular, the identified bonding step 30 exposes device die to a temperature of approximately 300 to 350° C. Immediately after execution of the identified bonding process step 30, a cooling step 32 is performed. In this step, the device die are placed on a steel chiller plate cooled by circulating water to a precise temperature of about 27° C. In this way, the device die are cooled to at least 100° C. at a rate of between about 0.6° C. per second and 1.0° C. per second in accordance with the present invention to thereby prevent premature copper precipitation.

EXAMPLE 4

Figure 5:
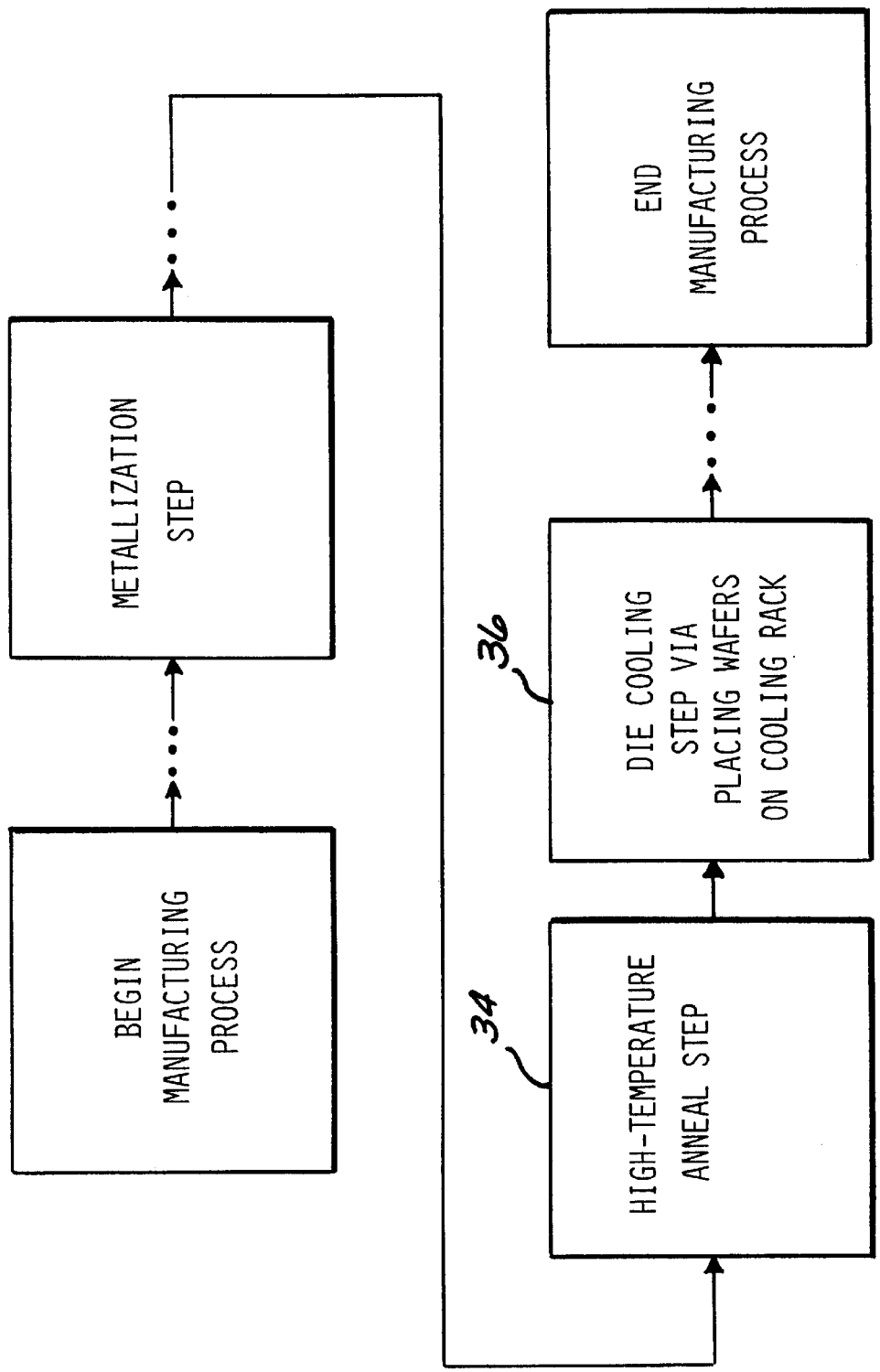
FIG. 5 is a general flow diagram of a process for the manufacturing of semiconductor microelectronic devices which particularly highlights how and when device die are cooled after a post-metallization, high-temperature anneal process step.

FIG. 5 shows the post-metallization step 34 as one which exposes device die to temperatures greater than 100° C. In particular, the identified anneal step 34 exposes the die or wafers to a temperature of approximately 400° C. during a time period of approximately eight hours. Immediately after execution of the identified anneal process step, a cooling step 36 is performed. In this instance, the device die or wafers are quickly pulled from the oven and placed on a cooling rack with artificial ventilation so that the wafers are cooled at a rate of about 0.88° C. per second.

EXAMPLE 5

Figure 6:
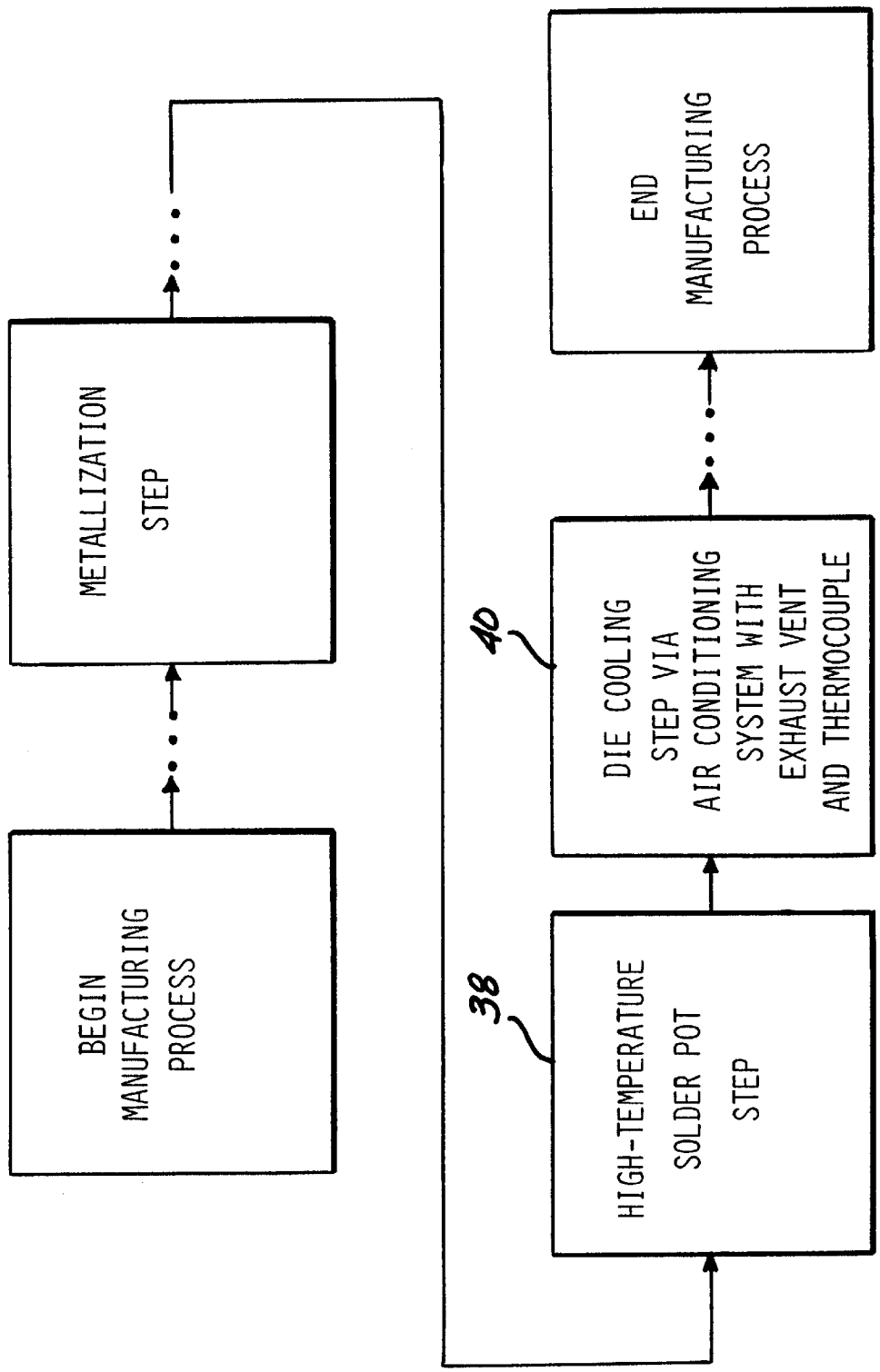
FIG. 6 is a general flow diagram of a process for the manufacturing of semiconductor microelectronic devices which particularly highlights how and when device die are cooled after a post-metallization, high-temperature solder pot process step.

In FIG. 6, the post-metallization step 38 is a solder pot process step which exposes device die to temperatures greater than 100° C. In particular, the identified solder pot step is a process step wherein, for example, the external leads of a packaged device die are dipped into a pot of hot molten solder to form lo a solder finish on the external leads. Immediately after execution of the identified solder pot process step, a cooling step 40 is performed. In this instance, the device die are quickly placed in an area where they are exposed to an air conditioning line/system which both pushes cold (20° C.) air over the device die and pulls air away from the die with an exhaust vent. Furthermore, the cooling rate of the device die are verified, maintained, and monitored by utilizing a temperature-sensitive process "mole." The mole is a thermocouple device which is sent through the solder pot process to determine instantaneous temperatures. The temperatures sensed by the thermocouple device are checked and plotted over time to ensure that a cooling rate of between about 0.6° C. and 1.0° C. per second. Such a check is completed once per working day, and the cool down rate after the solder pot process is thereby maintained at 0.7 to 0.8° C. per second.

It is to be understood that other types of high-temperature manufacturing process steps may also be identified in a given, device-specific semiconductor manufacturing process. Thus, according to the present invention, the device die in such other high-temperature process steps must be cooled down to at least 100° C. at a rate of between about 0.60° C. and 1.0° C. per second immediately after execution of each such identified high-temperature step to thereby prevent copper precipitation. It is also to be understood that for a particular semiconductor device manufacturing process, there more than likely may be more than one high-temperature, post-metallization process steps involved. In such a case, the device die must be immediately cooled down after each identified high-temperature step in accordance with the present invention to thereby prevent copper precipitation. For purposes of the present invention, a process step which exposes device die to a temperature greater than 100° C. is considered to be a high-temperature step which requires immediate cooling according to the present invention. It is to be understood that other cooling methods are possible which provide cooling or quenching at the rates stated herein.

While this invention has been described in terms of certain embodiments thereof, it is not intended that it be limited to the above description, but rather only to the extent set forth in the following claims.

The embodiments of the invention in which an exclusive property or privilege is claimed are defined in the following claims:

What is claimed is:

1. A process for preventing the formation of a copper precipitate in a copper-containing aluminum alloy metallization on a die, said process comprising the steps of:

identifying each manufacturing step after metallization which exposes said die to a temperature of greater than 100° C.; and, after each such step is performed, cooling said die to a temperature of at least 100° C. at a cooling rate in a range of about 0.6° C. to about 1.0° C. per second; and then placing the die in service, the metallization being substantially free of copper precipitates.

2. The process according to claim 1, wherein the step of cooling said die is achieved by movement of air delivered at a temperature sufficient to achieve said cooling rate.

3. The process according to claim 1, wherein said cooling step includes providing cooled air to an enclosure and moving the die to the enclosure after metallization.

4. The process according to claim 1, wherein said cooling step further comprises providing a thermocouple for monitoring said cooling rate.

5. The process according to claim 1, wherein said cooling step is conducted in a substantially closed housing having a ventilation port, and a fan mounted proximate said ventilation port for movement of air through said housing to cool said die.

6. The process according to claim 1, wherein said cooling step comprises arrangement of said die in spaced apart relation with movements of air about said die delivered at a temperature sufficient to achieve said cooling rate.

7. The process according to claim 1, wherein said cooling step comprises placing the die in heat transfer relationship with a chilled surface.

8. The process according to claim 1 wherein the step of cooling said die is conducted by artificial cooling means.

9. The process according to claim 8 wherein said artificial cooling means comprises a forced convection cooling apparatus.

10. The process according to claim 8 wherein said artificial cooling means comprises a chiller.

11. The process according to claim 1, wherein the metallization is chosen from the group consisting of AlCu and AlCuSi alloys.

12. The process according to claim 1, wherein the metallization is chosen from the group consisting of AlCu alloys containing 1 to 4 weight percent copper, and AlCuSi alloys containing 0.5 to 1 weight percent copper and 1 weight percent silicon.

13. A process for preventing the formation of a copper precipitate in a copper-containing aluminum alloy metallization on a die, said process comprising the steps of:

providing the metallization on the die so that the metallization is substantially free of copper precipitates;

identifying each manufacturing step after metallization which exposes said die to a temperature of greater than 100° C.; and, after each such step is performed, cooling said die to a temperature of at least 100° C. at a cooling rate in a range of about 0.6° C. to about 1.0° C. per second so that precipitation of copper precipitates in the metallization is substantially prevented; and then placing the die in service, the metallization being substantially free of copper precipitates.

14. The process according to claim 13, wherein the metallization is chosen from the group consisting of AlCu and AlCuSi alloys.

15. The process according to claim 13, wherein the metallization is chosen from the group consisting of AlCu alloys containing 1 to 4 weight percent copper, and AlCuSi alloys containing 0.5 to 1 weight percent copper and 1 weight percent silicon.

* * * * *